United States Patent
Lin (10) Patent No.: US 9,455,039 B2
(45) Date of Patent: Sep. 27, 2016

(54) CHARGE PUMP SYSTEM FOR REDUCING OUTPUT RIPPLE AND PEAK CURRENT

(71) Applicant: eMemory Technology Inc., Hsin-Chu (TW)

(72) Inventor: Yang-Chieh Lin, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/873,202

(22) Filed: Oct. 2, 2015

(65) Prior Publication Data

US 2016/0105100 A1    Apr. 14, 2016

Related U.S. Application Data (60) Provisional application No. 62/062,963, filed on Oct. 13, 2014.

(51) Int. Cl.

| | | |
|---|---|---|
| G05F 1/10 | (2006.01) | |
| G11C 16/14 | (2006.01) | |
| H01L 27/115 | (2006.01) | |
| G11C 5/06 | (2006.01) | |
| H01L 29/10 | (2006.01) | |
| H01L 29/06 | (2006.01) | |
| G11C 16/08 | (2006.01) | |
| H01L 27/092 | (2006.01) | |
| H02M 1/14 | (2006.01) | |
| G11C 16/04 | (2006.01) | |
| G11C 16/10 | (2006.01) | |
| G11C 16/30 | (2006.01) | |
| G11C 16/26 | (2006.01) | |
| H02M 3/07 | (2006.01) | |

(52) U.S. Cl.
CPC .............. *G11C 16/14* (2013.01); *G11C 5/063* (2013.01); *G11C 16/0433* (2013.01); *G11C 16/08* (2013.01); *G11C 16/10* (2013.01); *G11C 16/30* (2013.01); *H01L 27/092* (2013.01); *H01L 27/11521* (2013.01); *H01L 27/11526* (2013.01); *H01L 29/0642* (2013.01); *H01L 29/1095* (2013.01); *H02M 1/14* (2013.01); *G11C 16/26* (2013.01); *H02M 3/07* (2013.01)

(58) Field of Classification Search
CPC ......... H02M 3/07; H02M 1/14; G11C 5/145; G11C 5/147
USPC ....... 327/536, 379, 530, 538, 535, 148, 149, 327/157, 158; 365/189.09
See application file for complete search history.

(56) References Cited

U.S. PATENT DOCUMENTS

| | | | |
|---|---|---|---|
| 7,120,215 B2 | 10/2006 | Li | |
| 8,264,262 B2 | 9/2012 | An | |
| 2003/0058029 A1* | 3/2003 | Matsui | H02M 3/07 327/536 |

(Continued)

FOREIGN PATENT DOCUMENTS

| | | |
|---|---|---|
| CN | 101119065 A | 2/2008 |
| CN | 102163914 A | 8/2011 |

*Primary Examiner* — Lincoln Donovan
*Assistant Examiner* — Thomas Skibinski
(74) *Attorney, Agent, or Firm* — Winston Hsu; Scott Margo (57) ABSTRACT

A charge pump system includes a plurality of pump units, a control circuit, and a detection circuit. The plurality of pump units are used for generating a pump output voltage. The control circuit is coupled to the plurality of pump units and is used for controlling each pump unit of the plurality of pump units. The detection circuit is coupled to the control circuit and the plurality of pump units and is used for detecting the pump output voltage. When the pump output voltage is greater than a predetermined value, the detection circuit generates and latches a control signal to enable the control circuit. After the control circuit is enabled, when the pump output voltage is detected to be smaller than the predetermined value, the detection circuit generates a first pump enable signal to the control circuit for enabling a first pump unit of the plurality of pump units.

14 Claims, 7 Drawing Sheets

(56) References Cited

U.S. PATENT DOCUMENTS

2008/0036528 A1* 2/2008 Chen et al. ............. H02M 3/07 327/536

2011/0199152 A1 8/2011 Swei
2016/0197550 A1* 7/2016 Shao ..................... H02M 3/07 365/189.09

* cited by examiner

CHARGE PUMP SYSTEM FOR REDUCING OUTPUT RIPPLE AND PEAK CURRENT

CROSS REFERENCE TO RELATED APPLICATIONS

This application claims the benefit of U.S. provisional application No. 62/062,963, filed Oct. 13, 2014.

BACKGROUND OF THE INVENTION

1. Field of the Invention

The present invention illustrates a charge pump system, and more particularly, an adaptive charge pump system for reducing output ripple and peak current.

2. Description of the Prior Art

With the advancement of techniques, various memory devices or storage devices are applied to electronic devices. For example, dynamic random access memory (DRAM) is popularly used in personal computer. Specifically, an integrated circuit (IC) of the electronic device with memory device generally includes a charge pump system for providing voltages different from those provided by the power supply. In other words, the charge pump system can generate voltages for internal use that are different than the voltages provided at the power inputs of the IC. Various designs for charge pump systems are well known in the art and may include capacitors to store charges at different stages within the charge pump arrays. Some charge pump systems may use bypass capacitors on the output of the charge pump array to reduce noise on the output, and multiple charge pump arrays may be ganged in parallel.

Although conventional charge pump system can provide a specific or a desired voltage different from the power supply, two major disadvantages of using conventional charge pump system are unavoidable. First, power efficiency of the conventional charge pump system is degraded when a low voltage power supplies is applied. Second, since the conventional charge pump system cannot deal with adaptive charge pump arrays to provide an appropriate voltage output, the conventional charge pump system may suffer severe power consumption.

Thus, it is important to develop a charge pump system to adaptively control the charge pump arrays for reducing power consumption, output ripple and peak current.

SUMMARY OF THE INVENTION

In an embodiment of the present invention, a charge pump system is disclosed. The charge pump system includes a plurality of pump units, a control circuit, and a detection circuit. The plurality of pump units are used for generating a pump output voltage. The control circuit is coupled to the plurality of pump units and is used for controlling each pump unit of the plurality of pump units. The detection circuit is coupled to the control circuit and the plurality of pump units and is used for detecting the pump output voltage. When the pump output voltage is greater than a predetermined value, the detection circuit generates and latches a control signal to enable the control circuit. After the control circuit is enabled, when the pump output voltage is detected to be smaller than a predetermined value, the detection circuit generates a first pump enable signal to the control circuit for enabling a first pump unit of the plurality of pump units. After the first pump unit is enabled, when the pump output voltage is detected to be smaller than the predetermined value over a predetermined time interval, the control circuit enables a second pump unit of the plurality of pump unit. Similarly, subsequent pump units are enabled one by one when the pump output voltage is smaller than the predetermined value over the predetermined time interval.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
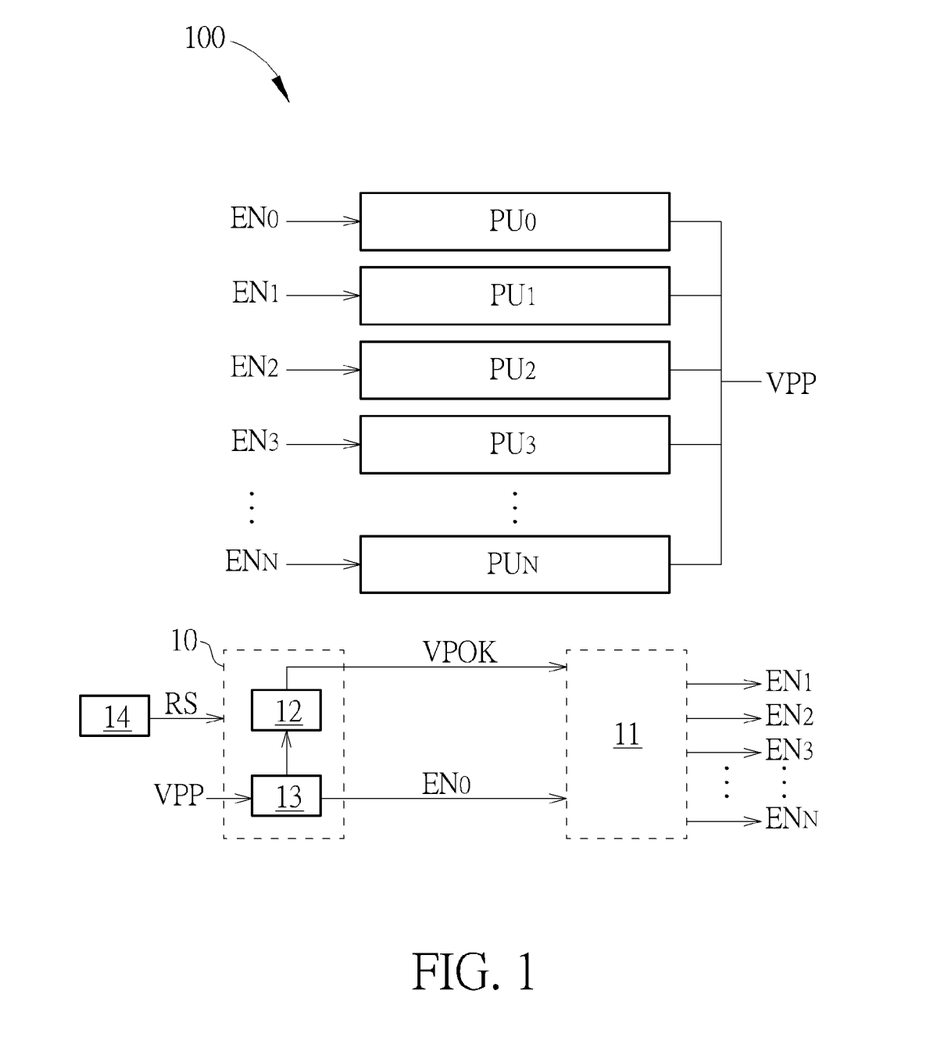
FIG. 1 illustrates a schematic structure illustration of a charge pump system according to an embodiment of the present invention.

FIG. 1 illustrates a schematic structure illustration of a charge pump system 100 according to an embodiment of the present invention. As shown in FIG. 1, the charge pump system 100 includes a plurality of pump units $PU_0$ to $PU_N$, a detection circuit 10, and a control circuit 11. The plurality of pump units $PU_0$ to $PU_N$ are used for generating a pump output voltage VPP. The control circuit 11 is coupled to the plurality of pump units $PU_0$ to $PU_N$ and is used for controlling each pump unit of the plurality of pump units $PU_0$ to $PU_N$. The detection circuit 10 is coupled to the control circuit 11 and the plurality of pump units $PU_0$ to $PU_N$ and is used for detecting the pump output voltage VPP. Specifically, the detection circuit 10 includes a voltage detector 13 and a detection latch circuit 12. The voltage detector 13 is used for detecting the pump output voltage VPP and is used for generating the first pump enable signal $EN_0$ and the control signal VPOK. In the embodiment, the control signal VPOK is regarded as a start enable control signal. Initially, the control signal VPOK is a low voltage signal. When the output voltage VPP is greater than a predetermined value (i.e., for example, a threshold value), the control signal VPOK becomes a high voltage signal for enabling the control circuit 11. Once the control signal VPOK being the high voltage signal, the control signal VPOK is latched by the detection latch circuit 12 so that the control circuit 11 can be proceeded for operation. The detection latch circuit 12 is coupled to the voltage detector 13 and is used for latching the control signal VPOK. The control circuit 11 can receive the control signal VPOK and the first pump enable signal $EN_0$ and output N pump enable signals $EN_1$ to $EN_N$ accordingly. The plurality of pump units $PU_0$ to $PU_N$ are controlled by the first pump enable signal $EN_0$ and N pump enable signals $EN_1$ to $EN_N$ respectively. Here, N is a positive integer. The circuit structure of the control circuit 11 is illustrated in later paragraphs. After the control circuit 11 is enabled, when the pump output voltage VPP is detected to be smaller than a predetermined value, the detection circuit 10 generates a first pump enable signal $EN_0$ (i.e., a high voltage) for enabling a first pump unit $PU_0$ of the plurality of pump units $PU_0$ to $PU_N$. Then, an adaptive operation of a pump unit array (i.e., pump unit array includes pump units $PU_0$ to $PU_N$) is performed by the control circuit 11. The method for performing the adaptive operation of a pump unit array is described in later paragraphs. A reset circuit 14 can be further introduced to the charge pump system 100 for performing a reset operation of the voltage detector 13 by using a reset signal RS. The reset circuit 14 can also be introduced to the charge pump system 100 for performing the reset operation of the detection latch circuit 12 by using the reset signal RS.

Figure 2:
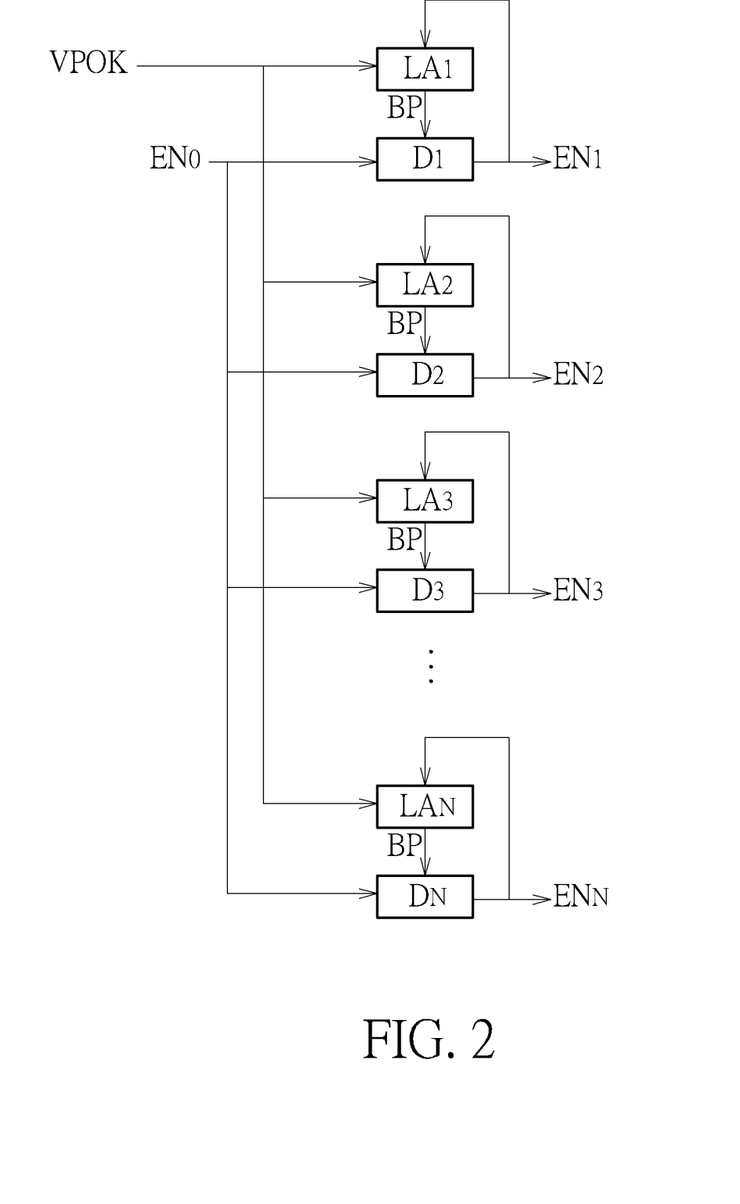
FIG. 2 illustrates a first circuit structure illustration of a control circuit of the charge pump system in FIG. 1 of the present invention.

FIG. 2 illustrates a first circuit structure illustration of the control circuit 11 of the charge pump system 100. As shown in FIG. 2, the control circuit 11 includes a plurality of delay circuits $D_1$ to $D_N$ and a plurality of latch circuits $LA_1$ to $LA_N$. The plurality of delay circuits $D_1$ to $D_N$ are used for lagging a first pump enable signal $EN_0$ to generate a plurality of pump enable signals $EN_1$ to $EN_N$ respectively. The plurality of latch circuits $LA_1$ to $LA_N$ are used for latching the plurality of pump enable signals $EN_1$ to $EN_N$ respectively. Specifically, each delay circuit of the plurality of delay circuits $D_1$ to $D_N$ is coupled to a corresponding latch circuit of the plurality of latch circuits $LA_1$ to $LA_N$. For example, in FIG. 2, the delay circuit $D_1$ is coupled to the latch circuit $LA_1$. The delay circuit $D_2$ is coupled to the latch circuit $LA_2$. The delay circuit $D_3$ is coupled to the latch circuit $LA_3$. The delay circuit $D_N$ is coupled to the latch circuit $LA_N$. In FIG. 2, the plurality of delay circuits $D_1$ to $D_N$ are coupled to the pump unit $PU_1$ to pump unit $PU_N$ respectively. The control signal VPOK is also received and latched by the plurality of latch circuits $LA_1$ to $LA_N$. Here, the plurality of delay circuits $D_1$ to $D_N$ are unilateral delay circuits for performing a rising edge delay signal operation. For example, the first pump enable signal $EN_0$ can be processed by suppressing a rising edge of voltage amplitude during a predetermined time interval through the delay circuits $D_1$. The structure of unilateral delay circuits and rising edge delay method are illustrated later. Here, the plurality of delay circuits have a same delay time or have different delay times. For example, consider two delay circuits $D_1$ and $D_2$. A delay time of the delay circuit $D_2$ can be larger than a delay time of the delay circuit $D_1$. In another example, a delay time of the delay circuit $D_2$ can be twice a delay time of the delay circuit $D_1$. However, the delay times of the plurality of delay circuits $D_1$ to $D_N$ are not limited by above description. In other embodiments, some (i.e., partial) of the plurality of delay circuits $D_1$ and $D_N$ have the same delay time while others have different delay times. Note that the plurality of delay circuits $D_1$ to $D_N$ in FIG. 2 form a delay pipeline circuit.

Figure 3:
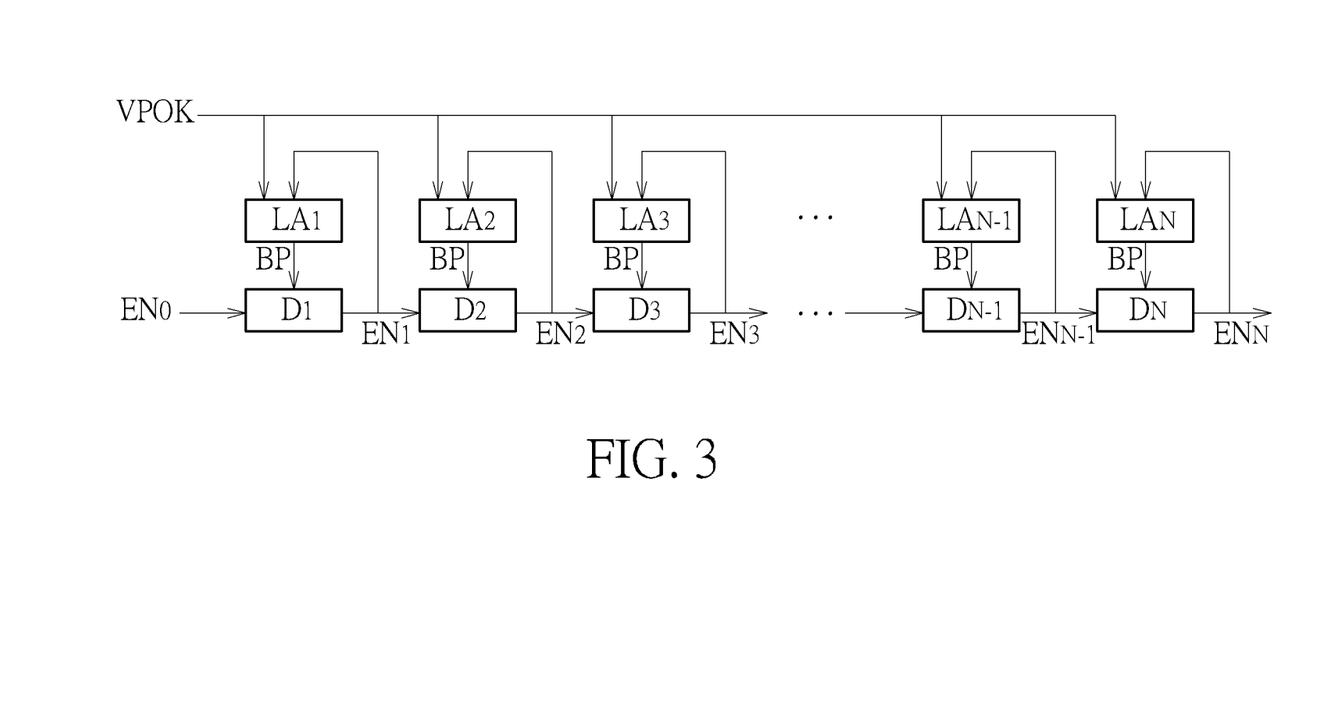
FIG. 3 illustrates a second circuit structure illustration of a control circuit of the charge pump system in FIG. 1 of the present invention.

FIG. 3 illustrates a second circuit structure illustration of a control circuit 11 of the charge pump system 100. As shown in FIG. 3, N latch circuits $LA_1$ to $LA_N$ and N delay circuits $D_1$ to $D_N$ are also introduced. Specifically, the circuit structure of the control circuit 11 in FIG. 3 is similar to the circuit structure of the control circuit 11 in FIG. 2. The difference is that $n^{th}$ delay circuit $D_n$ is coupled to $(n+1)^{th}$ delay circuit $D_{n+1}$ where n is an integer and $N>n\geq 1$ in FIG. 3. For example, the delay circuit $D_1$ is coupled to the delay circuit $D_2$. The delay circuit $D_2$ is coupled to the delay circuit $D_3$. The delay circuit $D_{N-1}$ is coupled to the delay circuit $D_N$. As a result, after the delay circuit $D_1$ receives a first pump enable signal $EN_0$, the delay circuit $D_1$ will output a pump enable signal $EN_1$ to the delay circuit $D_2$. After the delay circuit $D_2$ receives the pump enable signal $EN_1$, the delay circuit $D_2$ will output a pump enable signal $EN_2$ to the delay circuit $D_3$. After the delay circuit $D_N$ receives a pump enable signal $EN_{N-1}$, the delay circuit $D_N$ will output a pump enable signal $EN_N$. Equivalently, the plurality of delay circuits $D_1$ to $D_N$ in FIG. 3 form a tapped-delay-line structure. The plurality of delay circuits $D_1$ to $D_N$ are unilateral delay circuits for performing a rising edge delay signal operation.

In FIG. 2 and FIG. 3, each latch circuit of the plurality of latch circuits $LA_1$ to $LA_N$ is coupled to a corresponding delay circuit. When the latch circuit is set (i.e., a pump enable signal is latched), the output of the latch circuit can pass through the delay circuit by using a bypass signal BP, which is illustrated in the following literature. By using the plurality of delay circuits $D_1$ to $D_N$ and the plurality of latch circuits $LA_1$ to $LA_N$, pump enable signals $EN_1$ to $EN_N$ can selectively become high voltages if the pump output voltage VPP cannot reach a predetermined value over a predetermined time interval (i.e., preset delay).

Figure 4A:
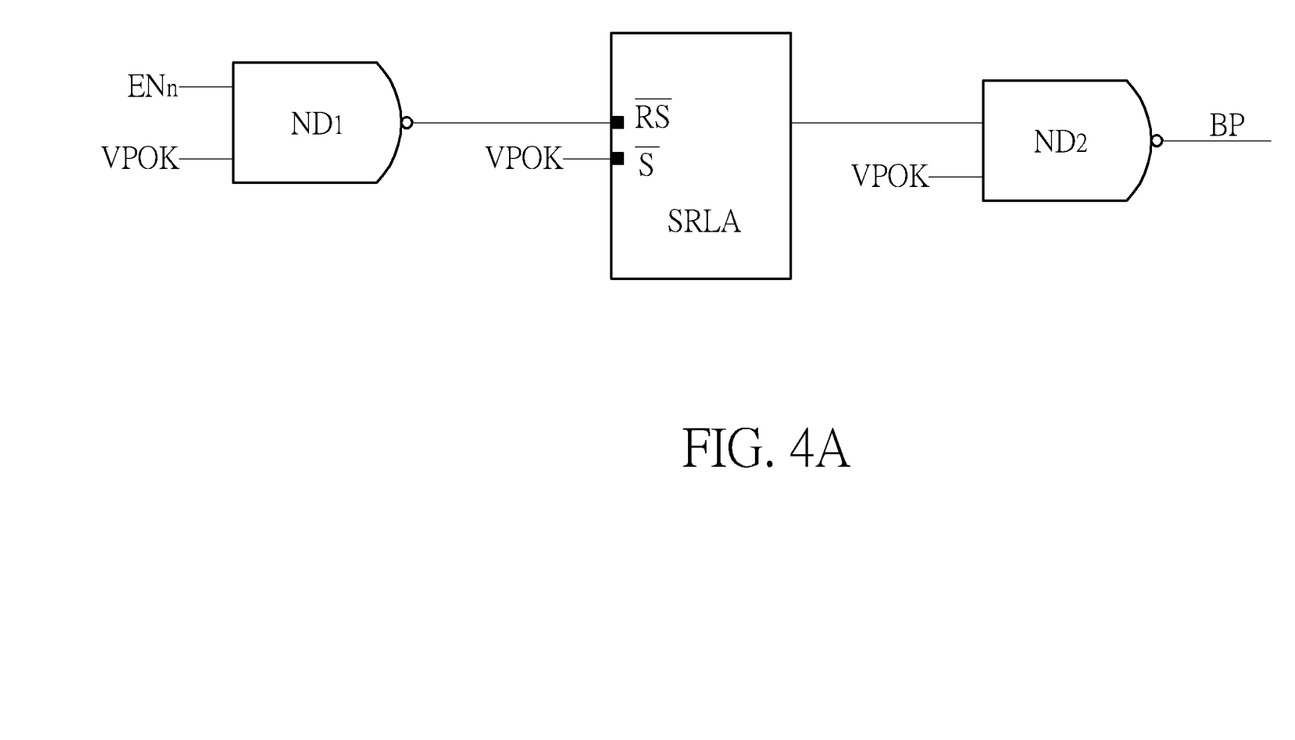
FIG. 4A illustrates a general circuit structure of each latch circuit of the charge pump system in FIG. 1 of the present invention.

FIG. 4A illustrates a general circuit structure of each latch circuit $LA_1$ to $LA_N$ of the charge pump system 100. Without loss of generality, a general latch mechanism being capable of generating of a bypass signal BP with respect to each latch circuit $LA_1$ to $LA_N$ is illustrated. As shown in FIG. 4A, two NAND gates ND1 and ND2, an SR latch SRLA (i.e., which denotes an essential component of each latch circuit $LA_1$ to $LA_N$) are introduced. The control signal VPOK is received by an input terminal of the NAND gate ND1, an input terminal of the SR latch circuit SRLA, and an input terminal of the NAND gate ND2. The $n^{th}$ pump enable signal $EN_n$ is received by another input terminal of the NAND gate ND1. The NAND gate ND1 is coupled to the SR latch circuit SRLA. The SR latch circuit SRLA is coupled to the NAND gate ND2. The NAND gate ND2 is used for outputting the bypass signal BP. Specifically, when the pump enable signal $EN_1$ (i.e., n=1) is received by another input terminal of the NAND gate ND1, the circuit structure in FIG. 4A corresponds to the latch circuit $LA_1$ in FIG. 2 and FIG. 3. When the pump enable signal $EN_2$ (i.e., n=2) is received by another input terminal of the NAND gate ND1, the circuit structure in FIG. 4A corresponds to the latch circuit $LA_2$ in FIG. 2 and FIG. 3. Similarly, when the pump enable signal $EN_N$ (i.e., n=N) is received by another input terminal of the NAND gate ND1, the circuit structure in FIG. 4A corresponds to the latch circuit $LA_N$ in FIG. 2 and FIG. 3. Generally, in FIG. 4A, when $n^{th}$ pump enable signal $EN_n$ and the control signal VPOK are high voltage signals, the bypass signal BP becomes a high voltage signal. Thus, the bypass signal BP with high voltage can be used for disabling the corresponding $n^{th}$ delay circuit (i.e., for example, disabling the delay circuit $D_n$). The delay circuit controlled by the bypass signal BP is illustrated below.

Figure 4B:
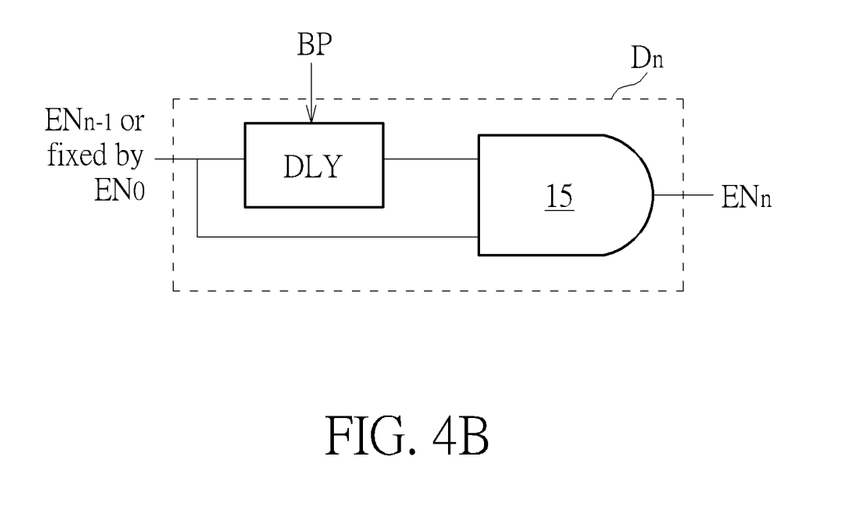
FIG. 4B illustrates a general equivalent circuit structure of each delay circuit.

FIG. 4B illustrates a general equivalent circuit structure of each delay circuit $D_1$ to $D_N$ of the control circuit 11. Here, the general equivalent circuit structure of the unilateral delay can be regarded as a delay circuit controlled by the bypass signal BP. As shown in FIG. 4B, $n^{th}$ delay circuit $D_n$ includes a delay component DLY and an AND gate 15. The delay component DLY has 3 terminals. The AND gate 15 has 3 terminals. The first terminal of the delay component DLY is used for receiving a first pump enable signal $EN_0$ (i.e., corresponding to FIG. 2) or receiving $(n-1)^{th}$ pump enable signal $EN_{n-1}$ (i.e., corresponding to FIG. 3). The second terminal of the delay component DLY is used for receiving the bypass signal BP. The third terminal of the delay component DLY is coupled to the first terminal of the AND gate 15. The second terminal of the AND gate 15 is coupled to the first terminal of the component DLY. The third terminal of the AND gate 15 is used for outputting the $n^{th}$ pump enable signal $EN_n$. For example, when the first pump enable signal $EN_0$ is received by the delay component DLY and the outputted pump enable signal is $EN_1$ (i.e., n=1), the circuit structure in FIG. 4B corresponds to the delay circuit $D_1$ in FIG. 2. When the first pump enable signal $EN_0$ is received by the delay component DLY and the outputted pump enable signal is $EN_2$ (i.e., n=2), the circuit structure in FIG. 4B corresponds to the delay circuit $D_2$ in FIG. 2. When the first pump enable signal $EN_0$ is received by the delay component DLY and the outputted pump enable signal is $EN_N$ (i.e., n=N), the circuit structure in FIG. 4B corresponds to the delay circuit $D_N$ in FIG. 2. Similarly, when the first pump enable signal $EN_1$ is received by the delay component DLY and the outputted pump enable signal is $EN_2$ (i.e., n=2), the circuit structure in FIG. 4B corresponds to the delay circuit $D_2$ in FIG. 3. When the first pump enable signal $EN_{N-1}$ is received by the delay component DLY and the outputted pump enable signal is $EN_N$ (i.e., n=N), the circuit structure in FIG. 4B corresponds to the delay circuit $D_N$ in FIG. 3. Referring to FIG. 4A, when $n^{th}$ pump enable signal $EN_n$ and the control signal VPOK are high voltage signals, the bypass signal BP becomes a high voltage signal. Such the bypass signal BP with high voltage can be used to disable the delay component DLY of $n^{th}$ delay circuit $D_n$ so that the pump enable signal $EN_0$ in FIG. 2 or the pump enable signal $EN_{n-1}$ in FIG. 3 can pass through the $n^{th}$ delay circuit $D_n$ and becomes the pump enable signal $EN_n$ directly without any delay, wherein n=1-N holds. Briefly, when the pump enable signal $EN_n$ and the control signal VPOK are high voltage signals, the delay circuit $D_n$ is disabled by receiving the bypass signal BP.

Figure 5:
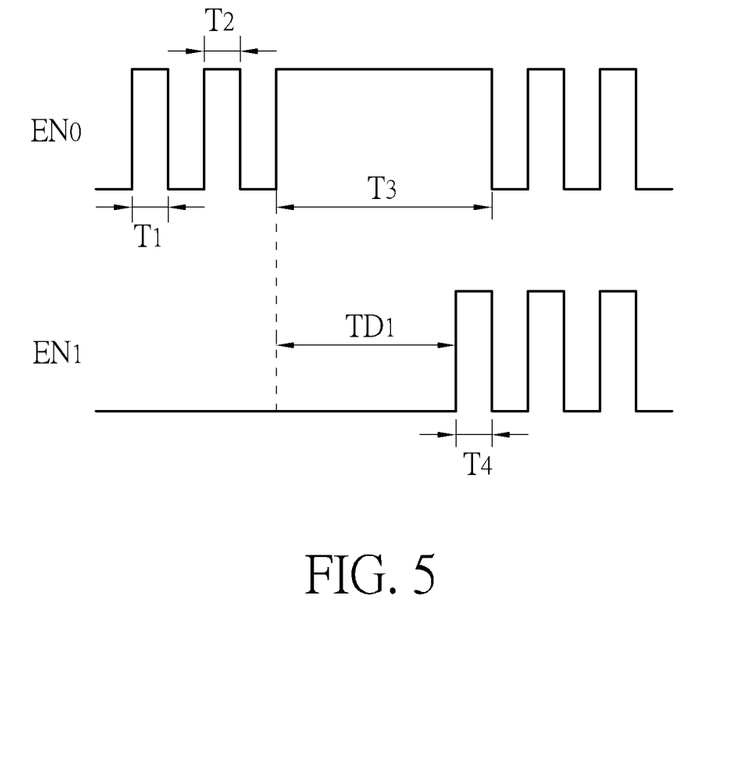
FIG. 5 illustrates a unilateral delay signal result of the charge pump system in FIG. 1 of the present invention.

FIG. 5 illustrates a unilateral delay signal result of the charge pump system 100. For simplicity, the result of unilateral delay from the first pump enable signal $EN_0$ to the pump enable signal $EN_1$ is illustrated below. Here, the unilateral delay is a signal processing method which can suppress a rising edge of signal voltage amplitude during a predetermined time interval. For example, in FIG. 5, a first rising edge of the first pump enable signal $EN_0$ is considered as a start time point of time interval $T_1$. The second rising edge of the first pump enable signal $EN_0$ is considered as a start time point of time interval $T_2$. The third rising edge of the first pump enable signal $EN_0$ is considered as a start time point of time interval $T_3$. The predetermined time interval (i.e., delay) is equal to $TD_1$. In the first rising edge of the first pump enable signal $EN_0$, since the time interval $T_1$ (i.e., with a high voltage signal) is smaller than the predetermined time interval $TD_1$, after processing the unilateral delay, the high voltage signal of the first pump enable signal $EN_0$ generates a low voltage signal of the pump enable signal $EN_1$ during the time interval $T_1$. In the second rising edge of the first pump enable signal $EN_0$, since the time interval $T_2$ (i.e., with a high voltage signal) is smaller than the predetermined time interval $TD_1$, after processing the unilateral delay, the high voltage signal of the first pump enable signal $EN_0$ generates a low voltage signal of the pump enable signal $EN_1$ during the time interval $T_2$. In the third rising edge of the first pump enable signal $EN_0$, since the time interval $T_3$ (i.e., with a high voltage signal) is greater than the predetermined time interval $TD_1$, after processing the unilateral delay, the high voltage signal of the first pump enable signal $EN_0$ generates a low voltage signal of the pump enable signal $EN_1$ during the predetermined time interval $TD_1$. Specifically, the high voltage signal of the first pump enable signal $EN_0$ maintains the high voltage during the time interval $T_4$ so that the pump enable signal $EN_1$ is a high voltage signal during the time interval $T_4$. Here, $T_4=T_3-TD_1$ holds. In the following, the method for adaptively enabling an appropriate number of charge pumps by using the unilateral delay and the corresponding waveforms of the charge pump system 100 are illustrated.

Figure 6:
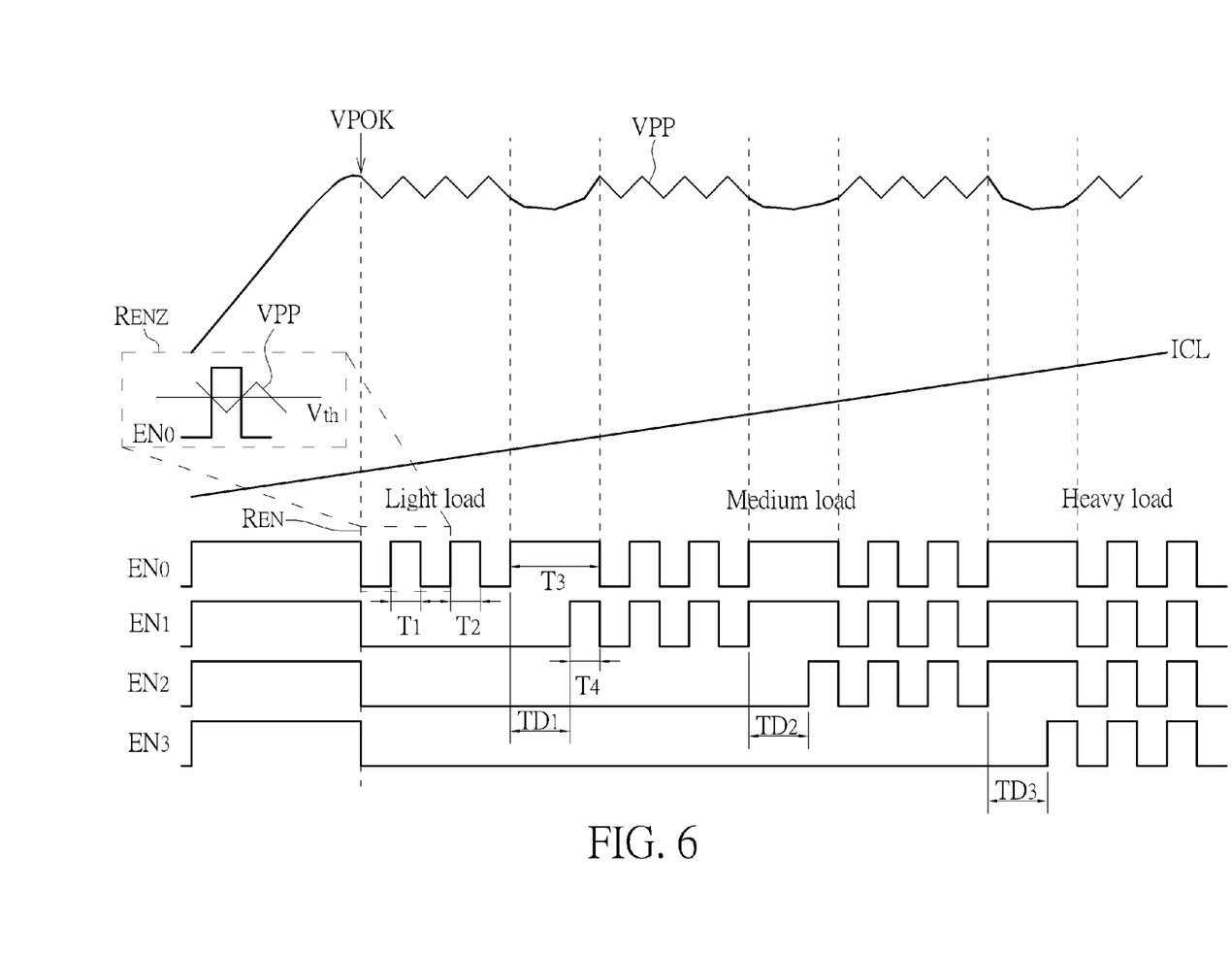
FIG. 6 illustrates a waveform illustration of the charge pump system in FIG. 1 of the present invention.

FIG. 6 illustrates a waveform illustration of the charge pump system 100. In FIG. 6, several signal waveforms are considered, including a waveform of pump output voltage VPP, a waveform of current loading curve ICL, a waveform of first pump enable signal $EN_0$, and waveforms of pump enable signal $EN_1$ to $EN_3$. For presentation simplicity, 4 pump enable signals $EN_0$ to $EN_3$ are considered for illustrating the operation method of the charge pump system 100. In the charge pump system 100, a pump output voltage VPP is detected by the detection circuit 10. Initially, when the pump output voltage VPP is greater than a predetermined value (i.e., 8V), the detection circuit 10 generates and latches a control signal VPOK to enable the control circuit 11. Then, the control circuit 11 is enabled regardless of the pump output voltage VPP. When the pump output voltage VPP is greater than the predetermined value, the first pump enable signal $EN_0$ outputted from the detection circuit 10 is a low voltage signal. When the pump output voltage VPP is smaller than the predetermined value (i.e., 8V), the first pump enable signal $EN_0$ outputted from the detection circuit 10 is a high voltage signal. A region $R_{EN}$ of the waveform of the first pump enable signal $EN_0$ and the correlation between the pump output voltage VPP and the predetermined value $V_{th}$ are illustrated in a region $R_{ENZ}$. When the pump output voltage VPP is greater than the predetermined value, it implies that the current charge pump has enough capability to deal with voltage pumping process. When the pump output voltage VPP is smaller than the predetermined value, it implies that the current charge pump is overloaded and is incapable of pumping to a high enough voltage amplitude. However, the pump output voltage VPP can be regarded as a power loading indicator which represents a current voltage loading. Theoretically, when the pump output voltage VPP is smaller than the predetermined value, an additional charge pump may be prepared to join the voltage pumping process. Specifically, the pump output voltage VPP may suffer a waveform fluctuation caused by other interference. To avoid over-sensitive charge pump enabling operation (i.e., false alarm error), several predetermined time intervals (i.e., delays) $TD_1$, $TD_2$, and $TD_3$ are introduced and can be applied to the unilateral delay process. For example, as illustrated in FIG. 5, time intervals $T_1$ and $T_2$ of the first pump enable signal $EN_0$ are smaller than the predetermined time interval $TD_1$. Thus, after processing the unilateral delay, the high voltage signal of the first pump enable signal $EN_0$ generates a low voltage signal of the pump enable signal $EN_1$ during the time intervals $T_1$ and $T_2$. Thus, an additional charge pump $PU_1$ is still disabled. In other words, although the amplitude of the pump output voltage VPP is not high enough during the time intervals $T_1$ and $T_2$, since the time intervals $T_1$ and $T_2$ are smaller than the predetermined time interval $TD_1$. The transient under pumping voltage result can be regarded as the transient voltage fluctuation caused by other interference and thus is ignored.

When the time intervals $T_3$ of the first pump enable signal $EN_0$ is greater than the predetermined time interval $TD_1$, as shown in FIG. 5 and FIG. 6, after processing the unilateral delay, the high voltage signal of the first pump enable signal $EN_0$ maintains a high voltage signal. Thus, the pump enable signal $EN_1$ is a high voltage signal during the time interval $T_4$ where $T_4=T_3-TD_1$ holds. Then, the pump enable signal $EN_1$ is latched and enables the additional charge pump $PU_1$ to join the voltage pumping process. In other words, when the amplitude of the pump output voltage VPP is not high enough over the predetermined time interval $TD_1$, the additional charge pump is enabled for joining the voltage pumping process. Similarly, the pump enable signal $EN_2$ and the pump enable signal $EN_3$ becomes high voltage signals under specific conditions that the amplitude of pump output voltage VPP is not high enough over the predetermined time intervals $TD_2$ and $TD_3$ respectively. With the charge pump being introduced one by one, the current loading curve ICL with respect to a current loading of the charge pump system 100 is a monotonically increasing function. In other words, in the charge pump system 100, after the first charge pump $PU_0$ is enabled, if the amplitude of the pump output voltage VPP is not high enough over the predetermined time interval, the total number of charge pumps currently used will increase by one. As a result, since the number of charge pumps currently used is minimized according to the pump output voltage VPP, the power consumption can be reduced, and the output ripple and peak current can be also reduced.

To sum up, the present invention discloses a charge pump system. The idea of the charge pump system is to use a unilateral delay for performing an adaptive charge pump operation. Specifically, the adaptive charge pump operation can minimize the number of enabled charge pumps. Thus, the charge pump system of the present invention can reduce power consumption, output ripple, and peak current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump system, comprising:
   a plurality of pump units configured to generate a pump output voltage;
   a control circuit coupled to the plurality of pump units and configured to control each pump unit of the plurality of pump units; and
   a detection circuit coupled to the control circuit and the plurality of pump units and configured to detect the pump output voltage;
   wherein when the pump output voltage is greater than a predetermined value, the detection circuit generates and latches a control signal to enable the control circuit;
   wherein after the control circuit is enabled, when the pump output voltage is detected to be smaller than the predetermined value, the detection circuit generates a first pump enable signal to the control circuit configured to enable a first pump unit of the plurality of pump units; and
   wherein after the first pump unit is enabled, when the pump output voltage is detected to be smaller than the predetermined value over a predetermined time interval, the control circuit enables a second pump unit of the plurality of pump unit.

2. The charge pump system of claim 1, wherein the control circuit comprises:
   a plurality of delay circuits configured to output a plurality of pump enable signals;
   a plurality of latch circuits configured to latch the plurality of pump enable signals;
   wherein each delay circuit of the plurality of delay circuits is coupled to a corresponding latch circuit of the plurality of latch circuits.

3. The charge pump system of claim 2, wherein the plurality of delay circuits are coupled to the plurality of pump units.

4. The charge pump system of claim 2, wherein a first delay circuit of the plurality of delay circuits is coupled to the first pump unit.

5. The charge pump system of claim 2, wherein the plurality of delay circuits have a same delay time.

6. The charge pump system of claim 2, wherein the plurality of delay circuits have different delay times.

7. The charge pump system of claim 6, wherein when the plurality of delay circuits comprises a first delay circuit and a second delay circuit, a delay time corresponding to the second delay circuit is larger than a delay time corresponding to the first delay circuit.

8. The charge pump system of claim 6, wherein when the plurality of delay circuits comprises a first delay circuit and a second delay circuit, a delay time corresponding to the second delay circuit is two times of a delay time corresponding to the first delay circuit.

9. The charge pump system of claim 2, wherein some of the plurality of delay circuits have a same delay time.

10. The charge pump system of claim 2, wherein the plurality of delay circuits form a delay pipeline circuit.

11. The charge pump system of claim 2, wherein the plurality of delay circuits are unilateral delay circuits configured to perform a rising edge delay signal operation.

12. The charge pump system of claim 1, wherein the detection circuit comprises:
   a voltage detector configured to detect the pump output voltage and to generate the first pump enable signal and the control signal; and
   a detection latch circuit coupled to the voltage detector and configured to latch the control signal.

13. The charge pump system of claim 12, further comprising:
   a reset circuit coupled to the detection circuit and configured to perform a reset operation of the voltage detector.

14. The charge pump system of claim 12, further comprising:
   a reset circuit coupled to the detection circuit and configured to perform a reset operation of the detection latch circuit.

* * * * *